United States Patent [19]

Shigehara et al.

[11] Patent Number: 5,208,558
[45] Date of Patent: May 4, 1993

[54] CRYSTAL OSCILLATOR HAVING PLURAL INVERTERS DISABLED AFTER START-UP

[75] Inventors: Hiroshi Shigehara, Tokyo; Ryuji Fujiwara; Kenichi Matsumoto, both of Ooita, all of Japan

[73] Assignee: Kabushiki Kaisha Toshiba, Kawasaki, Japan

[21] Appl. No.: 926,382

[22] Filed: Aug. 10, 1992

Related U.S. Application Data

[63] Continuation of Ser. No. 800,830, Nov. 27, 1991, abandoned.

[30] Foreign Application Priority Data

Nov. 29, 1990 [JP] Japan .................. 2-333074

[51] Int. Cl.$^5$ .............................................. H03B 5/26
[52] U.S. Cl. ............... 331/116 FE; 331/158; 331/160
[58] Field of Search ........... 331/109, 116 R, 116 FE, 331/158, 159, 160, 183

[56] References Cited

U.S. PATENT DOCUMENTS

| | | | |
|---|---|---|---|
| 4,039,973 | 8/1977 | Yamashiro | 331/116 FE |
| 4,255,723 | 3/1981 | Ebihara | 331/116 FE |
| 4,321,562 | 3/1982 | Igarashi | 331/116 FE |
| 4,716,383 | 12/1987 | Lofgren et al. | 331/117 FE |
| 4,896,122 | 1/1990 | Tahernia et al. | 331/158 |
| 5,041,802 | 8/1991 | Wei et al. | 331/116 FE |

FOREIGN PATENT DOCUMENTS 57-211582 12/1982 Japan .
2040633A 8/1980 United Kingdom .

*Primary Examiner*—Siegfried H. Grimm
*Attorney, Agent, or Firm*—Finnegan, Henderson, Farabow, Garrett & Dunner

[57] ABSTRACT

An oscillation circuit having a clocked inverter operating during a predetermined period of time after the start of the oscillation. A feedback circuit is formed by the clocked inverter and another inverter at the start time of the oscillation. The oscillation circuit is therefore driven by a large amount of current and thus the oscillation start time can be shortened and the oscillation start voltage can be lowered. On the other hand, the oscillation circuit is driven only by the other inverter after starting the oscillation. Since a constant current source is inserted serially in the path of the power source of the other inverter. A constant operating current always flows through the other inverter without being affected by the variations of the threshold voltage of the transistors and the variations of the power source voltages. As a result, a low consumption current characteristic of the oscillation circuit can be obtained under low power source voltage.

12 Claims, 10 Drawing Sheets

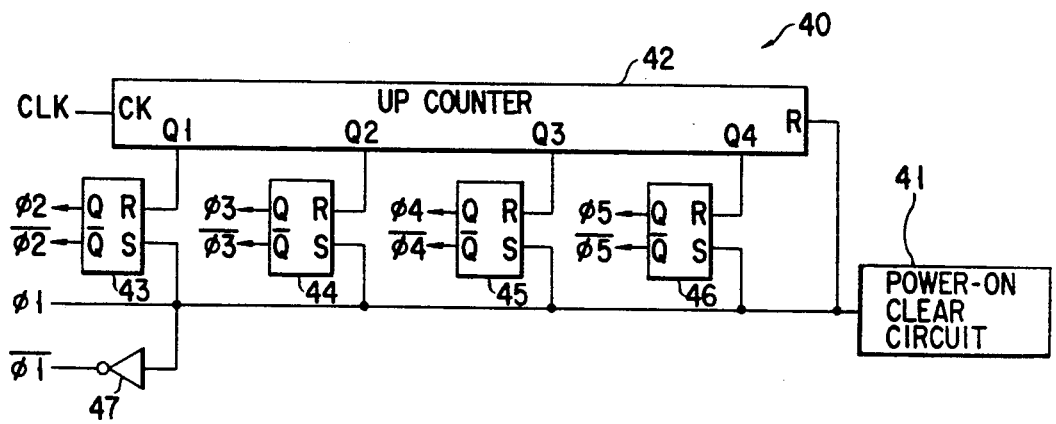
F I G. 7
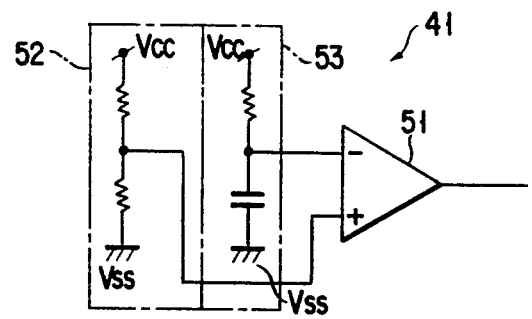
F I G. 8

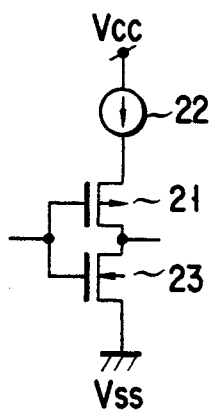
F I G. 11A
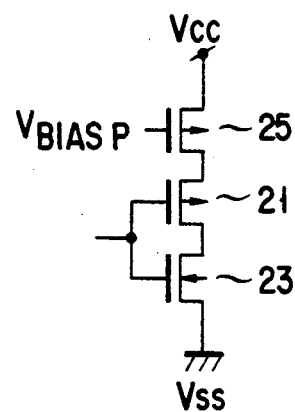
F I G. 11B
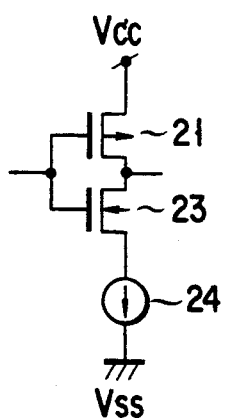
F I G. 12A
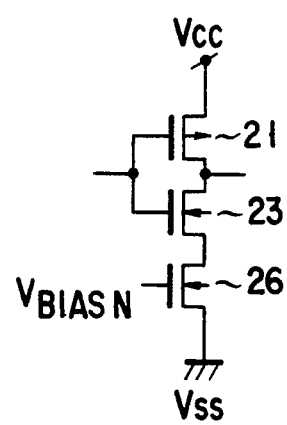
F I G. 12B

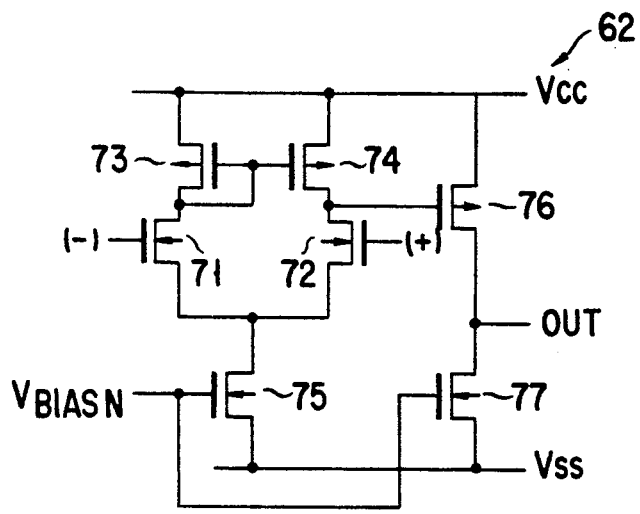
F I G. 14
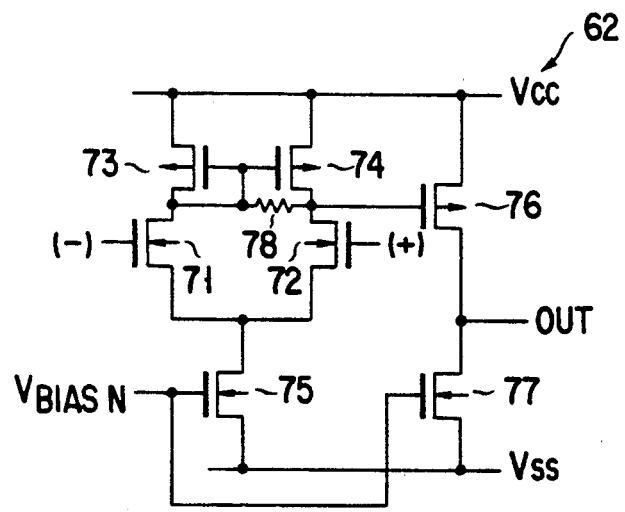
F I G. 15

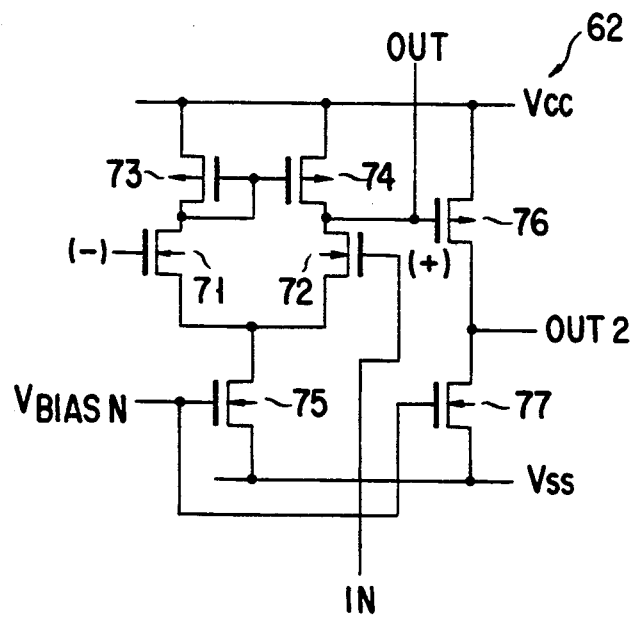
F I G. 16
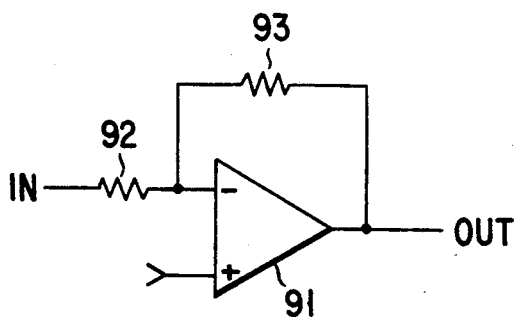
F I G. 17
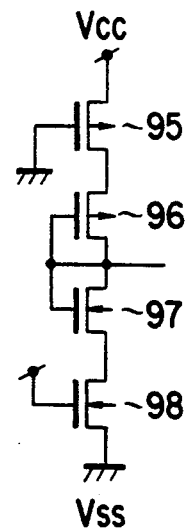
F I G. 18

CRYSTAL OSCILLATOR HAVING PLURAL INVERTERS DISABLED AFTER START-UP

This application is a continuation, of application Ser. No. 07/800,830 filed Nov. 27, 1991, now abandoned.

BACKGROUND OF THE INVENTION

1. Field of the Invention

The present invention relates to an oscillation circuit using an oscillator composed of a quartz oscillator or a ceramic oscillator as an oscillation source.

2. Description of the Related Art

FIG. 1 is a circuit diagram showing a conventional oscillation circuit using an oscillator. An oscillator 81 which is composed of a quartz oscillator or a ceramic oscillator, an inverter 82 and a feedback resistor 83 are connected in parallel. A capacitor 84 is connected between the earth voltage Vss and one terminal of the oscillator 81 and a capacitor 85 is also connected between the earth voltage Vss and the other terminal of the oscillator 81.

In general, with the above oscillation circuit, an oscillation start time is shortened and an oscillation start voltage is lowered if a large value of mutual conductance gm of the inverter 82 is set. As a result, the inverter 82 can be operated by a low voltage, for example, almost 3 V. However, a penetrating current, i.e., a current which flows through the inverter 82 from the power source voltage Vcc to the earth voltage Vss is increased when the oscillation circuit is in oscillation operation near the operating point so that it is difficult to obtain a low consumption current with the above oscillation circuit.

As shown in FIG. 2, another conventional oscillation circuit in that a clocked inverter 86 is connected in parallel with the inverter 82 has been developed. In the oscillation circuit in FIG. 2, both the inverter 82 and the clocked inverter 86 are operated to cause the oscillation until the oscillation begins. The clocked inverter 86 is turned off after a predetermined time period elapsed from the beginning of the oscillation, and thereafter the oscillation operation is maintained only by the inverter 82. Thus both the short oscillation start time and the low consumption current can be realized by the above circuit.

However, when the oscillation circuit is operated by the low voltage such as almost 3 V, the operating point of oscillation of the inverter 82 is (½)Vcc, i.e., 1.5 V where Vcc is the power source voltage. Generally, when the inverter 82 is embodied by means of the CMOS technique, it is constructed by connecting serially both the source-drain connections of P-channel MOS transistor and N-channel MOS transistor between the power source voltage Vcc and the earth voltage Vss, as shown in FIG. 3. A threshold voltage Vth of the MOS transistor is a typical parameter which has an influence upon the characteristics of both MOS transistors. The absolute value of the threshold voltage Vth is ordinarily set at about 1 V. At that time, the current Icc flowing at the operating point of the CMOS inverter is given by following proportional expression as $$Icc \propto (V_{GSN} - V_{thN})^2 \quad (1)$$

where $V_{GSN}$ is a gate-source voltage of the N-channel MOS transistor shown in FIG. 3, and $V_{thN}$ is a threshold voltage of the same.

However, a difference between the gate-source voltage $V_{GSN}$ and the threshold voltage VthN is reduced when the power source voltage Vcc is lowered. As a result, the variation of the current Icc is increased due to the variations of the power source voltage Vcc and the threshold voltage $V_{thN}$. For example, when $V_{thN} = 0.9 \pm 0.3$ V and Vcc $= 3 \pm 0.3$ V, a ratio of maximum value Icc(MAX) and minimum value Icc(MIN) is given by following equation.

$$\frac{Icc(MAX)}{Icc(MIN)} = \frac{\{(3.3/2) - 0.6\}^2}{\{(2.7/2) - 1.2\}^2} \quad (2)$$
$$= 49$$

There is a difference of 49 times between the maximum and the minimum values of the operating currents. Assume that the operating current Icc required to maintain the oscillation is, for example, 100 μA, so much current of 4.9 mA flows at maximum owing to the variations of the power source voltage Vcc and the threshold voltage $V_{thN}$.

Accordingly, even if it is tried to lower the consumption current with the oscillation circuit in FIG. 2, the variations of the operating currents are increased when the circuit is operated by the low power source voltage and thus the low consumption current cannot be attained by this circuit. In other words, the oscillation circuit of FIG. 2 can not only shorten he oscillation start time, but also lower the oscillation start voltage. However, it cannot lower the consumption current under the low power source voltage.

SUMMARY OF THE INVENTION

The present invention is made to overcome the above drawback, and it is an object of the present invention to provide an oscillation circuit which has a characteristic of a low consumption current under a low power source voltage and has characteristics of both short oscillation start time and low oscillation start voltage.

According to an aspect of the present invention, an oscillation circuit comprises an oscillator composed of one of a quartz oscillator and a ceramic oscillator; a clocked inverter controlled so as to operate for a predetermined period of time after oscillation begins, an input and an output of which being connected across the oscillator; and an inverter having a constant current means connected in serial in a path of a power source, an input and an output of which being connected across the oscillator.

According to another aspect of the present invention, an oscillation circuit comprises an oscillator composed of one of a quartz oscillator and a ceramic oscillator; a plurality of clocked inverters having the same circuit threshold value and controlled such that all clocked inverters begin their oscillation at an oscillation time and terminate their operations at different time each other, inputs and outputs of which being connected in parallel across the oscillator; and an inverter having a constant current means connected in serial in a path of a power source, an input and an output of which being connected across the oscillator.

According to still another aspect of the present invention, an oscillation circuit comprises an oscillator composed of one of a quartz oscillator and a ceramic oscillator; a plurality of clocked inverters controlled such that each operates only for a period of time after the oscillation begins, inputs and outputs of which being connected in parallel across the oscillator; an inverter having the same circuit threshold value as said plurality of clocked inverters, an input and an output of which being short-circuited; and a voltage comparator having one input terminal, the other input terminal and an output terminal and driven by a constant-current source, the one input terminal being connected to the output of the inverter, the other input terminal being connected to the inputs of the plurality of clocked inverters, and the output terminal being connected to the outputs of the plurality of said clocked inverters.

According to still another aspect of the present invention, an oscillation circuit comprises an oscillator composed of one of a quartz oscillation and a ceramic oscillator; a plurality of clocked inverters controlled to operate for a predetermined period of time after an oscillation starts, inputs and outputs of which being connected in parallel across said oscillator; an inverter having the same circuit threshold value as said plurality of clocked inverters, an input and an output of which being short-circuited; and a linear amplifier circuit having one input terminal, the other input terminal and an output terminal and driven by a constant-current source, said one input terminal being connected to said output of said inverter, said the other input terminal being connected to said inputs of said plurality of clocked inverters, and said output terminal being connected to said outputs of said plurality of clocked inverters.

In the present invention, since the clocked inverter operates during a predetermined period of time after the start of the oscillation, a feedback circuit is formed by both the clocked inverter and the inverter at the start time of the oscillation. The oscillation circuit is therefore driven by a large current and thus the oscillation start time can be shorten and also the oscillation start voltage can be lowered. On the other hand, the oscillation circuit is driven only by the inverter after starting the oscillation. Since a constant current means is inserted serially in the path of the power source of the inverter, the constant operating current always flows through the inverter without being affected by the variations of the threshold voltage of the transistors and the variations of the power source voltages. As a result, a low consumption current characteristic of the oscillation circuit can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a circuit diagram of an arrangement of the control circuit in the first embodiment in FIG. 4;

FIG. 8 is a circuit diagram of a detailed arrangement of the power-on clear circuit in FIG. 7;

FIGS. 11A and 11B are circuit diagrams of another arrangement of the inverter in FIG. 4;

FIGS. 12A and 12B are circuit diagrams of still another arrangement of the inverter in FIG. 4;

FIG. 14 is a circuit diagram of an arrangement of the voltage comparator in FIG. 13;

FIG. 15 is a circuit diagram of another arrangement of the voltage comparator in FIG. 13;

FIG. 16 is a circuit diagram of still another arrangement of the voltage comparator in FIG. 13;

FIG. 17 is a circuit diagram of a part of a third embodiment of an oscillation circuit according to the present invention; and FIG. 18 is a circuit diagram of the clocked inverters to be used in FIG. 17.

DETAILED DESCRIPTION OF THE PREFERRED EMBODIMENTS

There will now be described in detail embodiments of an oscillation circuit according to the present invention with reference to the drawings.

Figure 1:
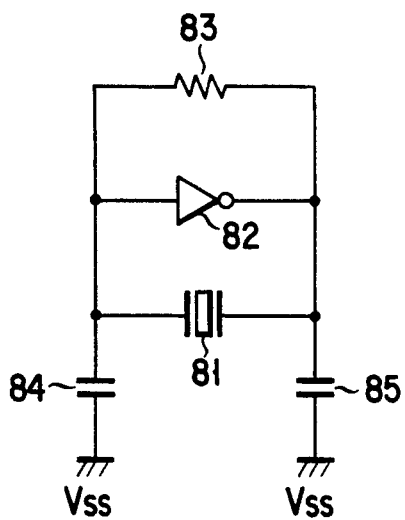
FIG. 1 is a circuit diagram of a conventional oscillation circuit.
Figure 2:
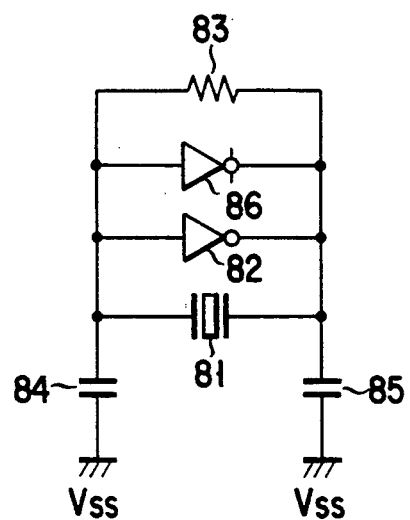
FIG. 2 is a circuit diagram of another conventional oscillation circuit.
Figure 3:
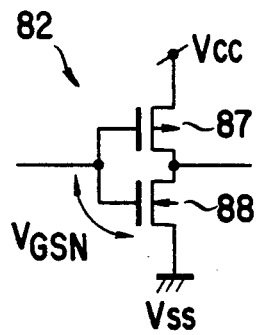
FIG. 3 is a circuit diagram of a CMOS inverter in FIGS. 1 and 2.
Figure 4:
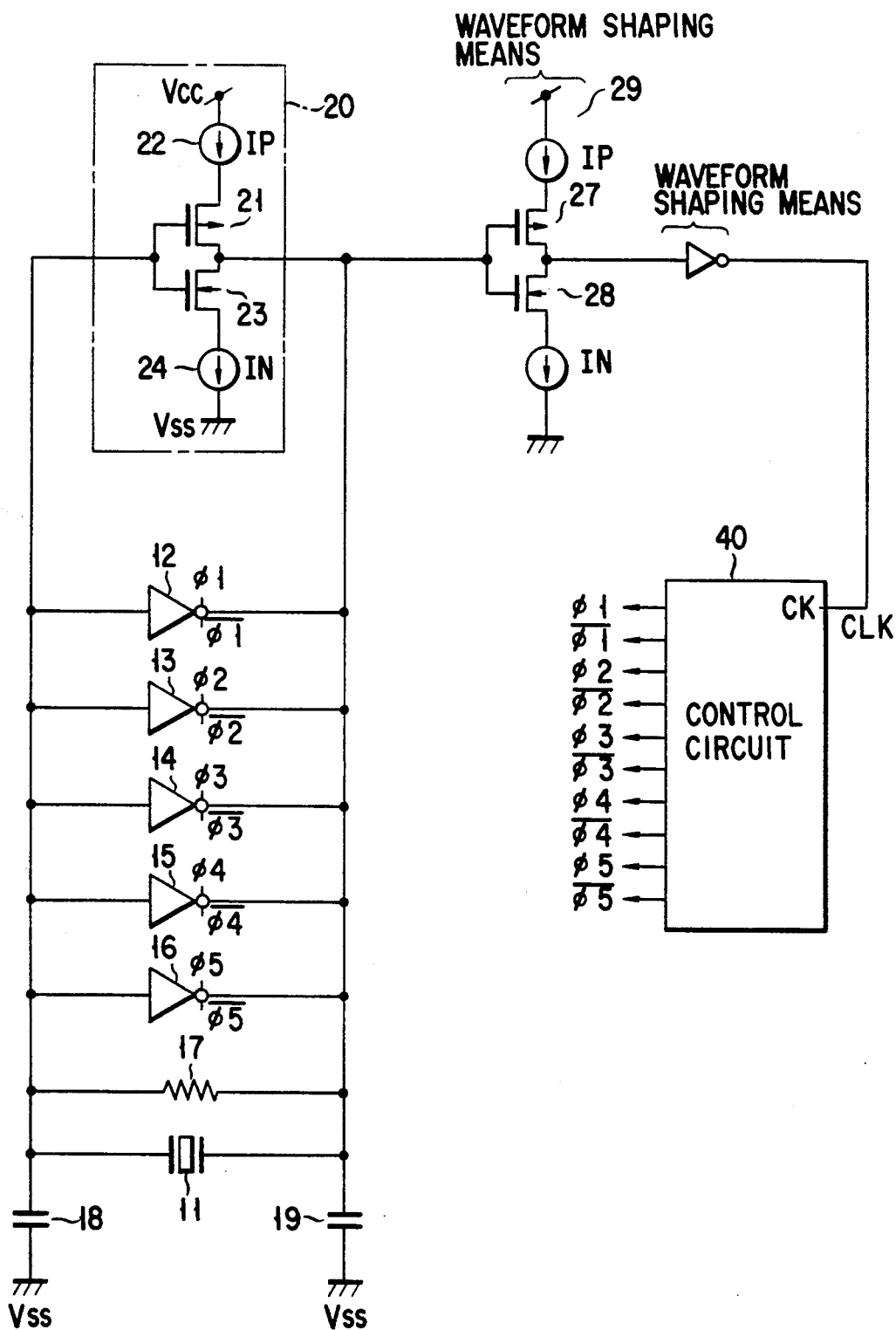
FIG. 4 is a circuit diagram of a first embodiment of an oscillation circuit according to the present invention.

FIG. 4 is a circuit diagram showing an arrangement of a first embodiment of the oscillation circuit according to the present invention. In FIG. 4, five CMOS clocked inverters 12 to 16, for example, and a feedback resistor 17 are connected in parallel across an oscillator 11 composed of a quartz oscillator or a ceramic oscillator. Control signal pairs $\phi1$, $\overline{\phi1}$; $\phi2$, $\overline{\phi2}$; $\phi3$, $\overline{\phi3}$; $\phi4$, $\overline{\phi4}$; and $\phi5$, $\overline{\phi5}$ are supplied to clock signal input terminals of the five CMOS clocked inverters 12 to 16, respectively. Operations of these clocked inverters 12 to 16 are controlled by the corresponding control signal pair. A capacitor 18 is connected between one terminal of the oscillator 11 and the earth voltage Vss and a capacitor 19 is also connected between the other terminal of the oscillator 11 and the earth voltage Vss. An input terminal and an output terminal of a CMOS inverter 20 is connected in parallel with the five clocked inverters 12 to 16 across the oscillator 11.

As shown in FIG. 4, the inverter 20 comprises a P-channel MOS transistor 21 a source and drain connection of which is inserted between the power source voltage Vcc and an output terminal, and a gate of which is connected to an input terminal; a constant-current source 22 connected between the source of the MOS transistor 21 and the power source voltage Vcc and having a current value IP: an N-channel MOS transistor 23 a source and drain connection of which is connected between the output terminal and the earth voltage Vss, and a gate of which is connected to the input terminal;

and a constant-current source 24 connected between the source of the MOS transistor 23 and the earth voltage Vss and having a current value IN. A current flowing through the inverter 20, i.e., current values IP and IN of the constant-current sources 22 and 24, is set in advance at a minimum value required to maintain the oscillation. A control circuit 40 in FIG. 4 generates the control signal pairs $\phi 1$, $\phi 1$; $\phi 2$, $\phi 2$; $\phi 3$, $\phi 3$; $\phi 4$, $\phi 4$; and $\phi 5$, $\phi 5$ which are used in the clocked inverters 12 to 16. The control circuit 40 energizes all the control signal pairs to operate the clocked inverters 12 to 16 at a start time of oscillation. After a predetermined time elapsed from the start of the oscillation, the control circuit 40 deenergizes the control signal pairs so that each control signal pair has an operation terminating time different from each other.

An inverter 29 is provided as a waveform shaping means for an output of the inverter 20. Since an output waveform of the inverter 20 is not fully swung between the earth voltage Vss and power source voltage Vcc, a penetrating current is increased sometimes if the output of the inverter 20 is used as an input signal of an ordinary inverter which is composed of a P-channel MOS transistor and an N-channel MOS transistor. However, if the output of the inverter 20 is waveform-shaped by the inverter 29 which has the same arrangement as the inverter 20, the penetrating current can be controlled with the constant-current source and thus the low consumption can be obtained. Since the inverter 29 has the same arrangement as the inverter 20, as shown in FIG. 4, a circuit threshold value of the inverter 29 is identical to that of the inverter 20. As a result, when an amplitude of the output of the inverter 20 is small, a waveform-shaped output can be outputted from the inverter 29.

Figure 5:
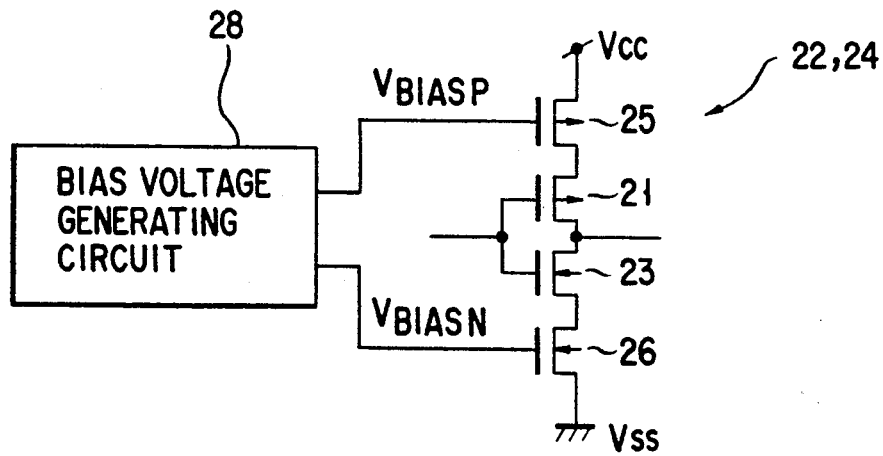
FIG. 5 is a circuit diagram of the constant-current sources in the first embodiment in FIG. 4.

FIG. 5 is a circuit diagram of the constant-current sources 22 and 24 in the inverter 20 in the first embodiment of FIG. 4. The constant-current sources 22 and 24 comprise respectively a P-channel MOS transistor 25 a gate of which is supplied with a predetermined bias voltage $V_{BiasP}$; an N-channel MOS transistor 26 a gate of which is supplied with a predetermined bias voltage $V_{BiasN}$; and a bias voltage generating circuit 28 for generating the bias voltages $V_{BiasP}$ and $V_{BiasN}$.

Figure 6:
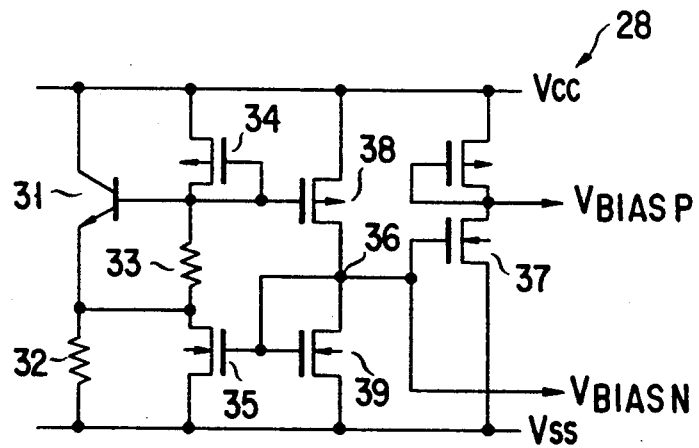
FIG. 6 is a circuit diagram of an example of the bias voltage generating circuit used in the circuit in FIG. 5.

FIG. 6 is a circuit diagram of an example of the bias voltage generating circuit 28 used in the circuit of FIG. 5. In the generating circuit 28, a resistor 32 is connected to an emitter of an NPN bipolar transistor. Thus a predetermined collector current is caused to flow through the bipolar transistor 31 and therefore a substantially constant voltage, for example, almost 0.7 V is generated between the base and the emitter of the bipolar transistor 31. This constant voltage is used to generate the bias voltages $V_{BiasP}$ and $V_{BiasN}$. More particularly, a base-emitter voltage of the bipolar transistor 31 is applied across a resistor 33. A current flowing through the resistor 33 is supplied to a current-mirror circuit 34 as an input current. An output current of the current-mirror circuit 34 is also supplied to another current mirror circuit 35 as an input current. Further, an output current of the current-mirror circuit 35 is fed back to the current-mirror circuit 34 as an input current. The bias voltage $V_{BiasN}$ which is applied to the gate of the N-channel MOS transistor 26 can be obtained as a voltage of a common node 36 between the current-mirror circuits 38 and 39. The bias voltage $V_{BiasP}$ which is applied to the gate of the P-channel MOS transistor 25 can also be obtained by shifting the bias $V_{BiasN}$ to the power source voltage Vcc side by an inverter 37.

FIG. 7 is a circuit diagram of an arrangement of the control circuit 40 in the embodiment of FIG. 4. The control circuit 40 comprises a power-on clear circuit 41 which generates a power-on clear signal with a predetermined pulse width when the power source is turned on; an up counter 42 which is reset by the power-on clear signal and to which a signal generated by the oscillation circuit including the control circuit 40 is supplied as a counter clock input CLK; four flip-flop circuits 43, 44, 45 and 46 which are commonly set by the power-on clear signal and are respectively reset by count output signals Q1, Q2, Q3 and Q4 of the up counter 42; and an inverter 47 for inverting the power-on clear signal. The control signals $\phi 1$ and $\phi 1$ outputted from the power-on clear circuit 41 and the inverter 47, respectively. The control signals $\phi 2$ and $\phi 2$ are outputted from the flip-flop circuit 43, the control signals $\phi 3$ and $\phi 3$ are outputted from the flip-flop circuit 44, the control signals $\phi 4$ and $\phi 4$ are outputted from the flip-flop circuit 45, and the control signals $\phi 5$ and $\phi 5$ are outputted from the flip-flop circuit 46.

FIG. 8 is a circuit diagram of a detailed arrangement of the power-on clear circuit 41 in FIG. 7. The circuit 41 comprises a voltage comparator 51 which has an inverting input terminal (−) and a non-inverting input terminal (+); a voltage divider circuit 52 which has two resistors connected serially between the power source voltage Vcc and the earth voltages Vss and divides the voltage Vcc at a predetermined ratio; and an integration circuit 53 which consists of a resistor and a capacitor connected serially between the power source voltage Vcc and the earth voltage Vss and integrates the voltage Vcc at a constant time constant when the power source is turned on. An output of the integration circuit 53 and an output of the voltage divider circuit 52 are inputted into the inverting input terminal (−) and the non-inverting input terminal (+) of the voltage comparator 51, respectively.

Figure 9:
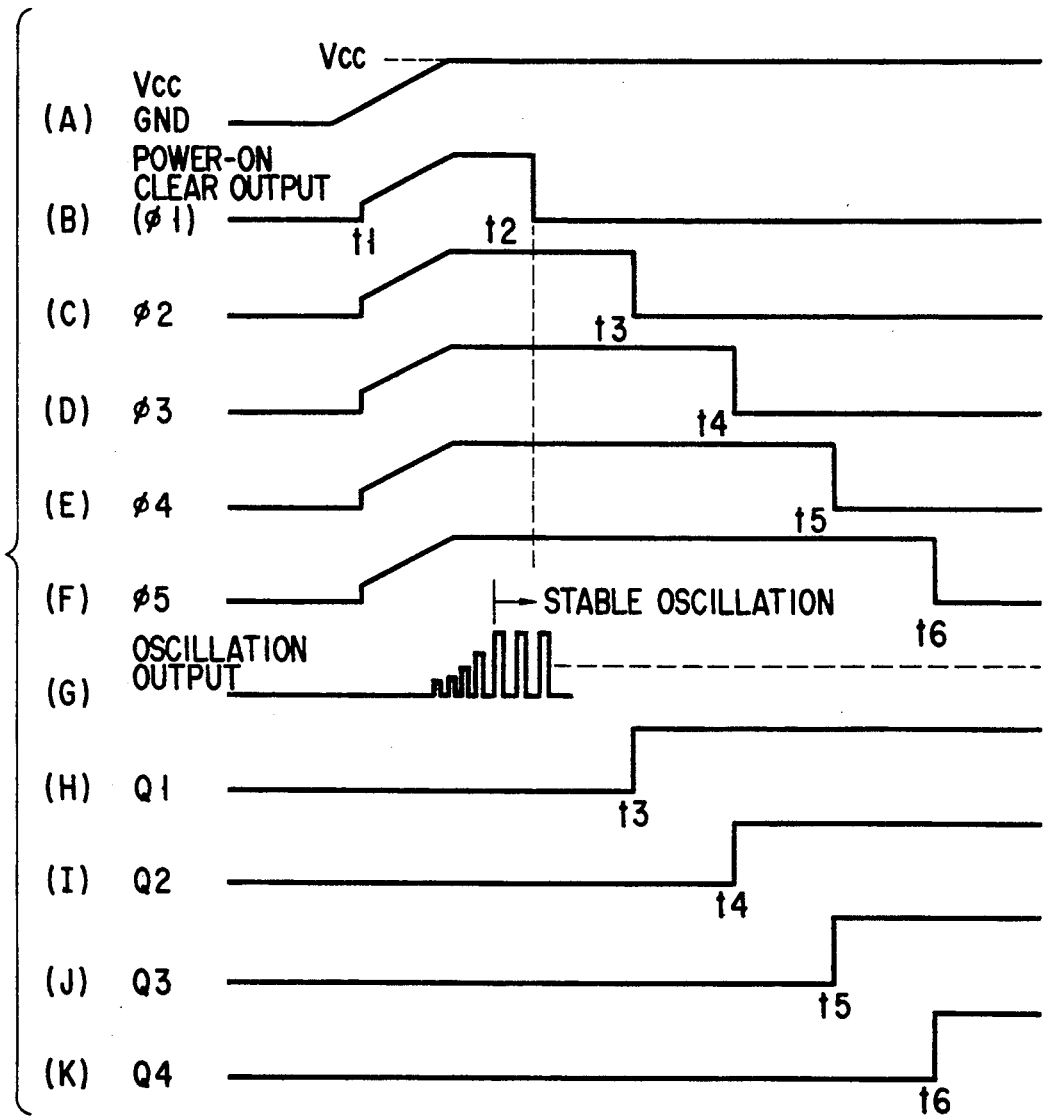
FIG. 9 is a diagram for illustrating operation waveforms in the first embodiment in FIG. 4.

Operations of the first embodiment of the oscillation circuit shown in FIG. 4 will now be described with reference to FIG. 9. First, when the power source Vcc is turned on (FIG. 9(A)), the power-on clear signal with a predetermined pulse width and at an "H" level is generated by the power-on clear circuit 41 in the control circuit 40 of FIG. 7 (FIG. 9(B)). Thus the signals $\phi 1$ and $\phi 1$ set at "H" and "L" levels at a time $t_1$, respectively, to energize the control signal pair $\phi 1$ and $\phi 1$ (FIG. 9(B)). Then, four flip-flop circuits 43 to 46 are set by the power-on clear signal, respectively. As a result, the signals $\phi 2$, $\phi 3$, $\phi 4$ and $\phi 5$ are set simultaneously at an "H" level at the time $t_1$ (FIG. 9(C)(D)(E)(F)) whereas the signal $\phi 2$, $\phi 3$, $\phi 4$, and $\phi 5$ are set simultaneously at an "L" level. Therefore, the control signal pairs $\phi 2$, $\phi 3$; $\phi 3$; $\phi 4$, $\phi 4$; and $\phi 5$, $\phi 5$ are energized parallelly at the same time. During the time period $t_1$–$t_2$ in FIG. 9, all the clocked inverters 12 to 16 in FIG. 4 are operated. More particularly, all the clocked inverters 12 to 16 and the inverter 20 operate immediately after the turning-on of the power source, and, since the load is driven by a large amount of current, a time period required for beginning the oscillation is shortened. In the present invention, a beginning of the oscillation is defined such that an amplitude and a frequency of the oscillation output have predetermined values, respectively.

When the oscillation operation is stabilized to a certain extent after starting the oscillation (FIG. 9(G)), the output of the power-on clear circuit 41 is inverted at an "L" level at a time $t_2$ (FIG. 9(B)). A time period $t_1$-$t_2$ during when the output signal is inverted from an "H" level to an "L" level is determined beforehand by the time constant of the integration circuit 43 shown in FIG. 8. When the output of the power-on clear circuit 41 is inverted to an "L" level, the output of the inverter 47 in FIG. 7 is turned to an "H" level to deenergize the control signal pair $\phi 1$ and $\overline{\phi 1}$ (FIG. 9(B)). Hence, the clocked inverter 12 in operation stops its operation at the time $t_2$ and thus the output terminal becomes a high inpedance state. The current driving capability for the load is decreased by the amount of the clocked inverter 12.

Following that the output of the power-on clear circuit 41 is changed to an "L" level, a reset of the up counter 42 in FIG. 7 and a set of four flip-flop circuits 43 to 46 are released. The up counter 42 thereafter starts to count the oscillation signals generated.

When a predetermined time $t_2$-$t_3$ elapsed from when the up counter 42 begins to count, a lower output signal Q1 is first raised to an "H" level (FIG. 9(H)). As a the control signal pair $\phi 2$, $\overline{\phi 2}$ which are the Q, $\overline{Q}$ output signals. Hence, the clocked inverter 13 in operation stops its operation and thus the current driving capability is further decreased by the amount of the clocked inverter 12. When the up counter 42 keeps the counts continuously, more significant output signals are raised sequentially to an "H" level at times t4, t5, and t6. The flip-flop circuits 44 to 46 are therefore reset in sequence and thus the clocked inverters 14 to 16 stop their operations successively (FIGS. 9(I)(J) and (K)).

Figure 10A:
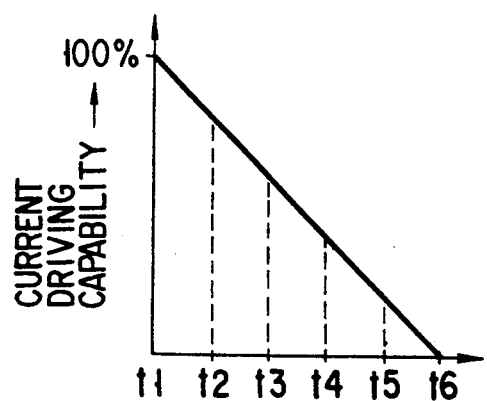
FIGS. 10A to 10C are diagrams each showing current driving capability of the oscillation circuit in FIG. 4.

If all the clocked inverters 12 to 16 are set to have the same current driving capability, then total current driving capability is decreased by a constant amount, as shown in FIG. 10A, each time when one of the clocked inverters 12 to 16 stops its operation. That is, the current driving capability of all the inverters can be changed linearly. The abscissa of FIG. 10A is a time axis.

As described above, the operations of a plurality of clocked inverters are stopped sequentially one by one so that all the current driving capability including that of the inverter 20 are sequentially decreased. Hence, the disadvantage such that the oscillation has to be stopped in the course of the operation does not occur.

After the clocked inverters stop perfectly, a feedback circuit is formed by the inverter 20 alone. A minimum current required to maintain the oscillation can be flown through the inverter 20. A constant current can always be passed through the inverter 20 even if the variations of the power source voltage Vcc and the threshold voltages of the transistors 21 and 23 are caused. The consumption current can therefore be lowered in a stationary state where the oscillation operation is stable.

A modification of the above embodiment will then be described. Although five clocked inverters are provided in parallel in the above embodiment, only one clocked inverter that is stopped after the oscillation operation reaches its stable state can be provided in the modification.

Figure 10B:
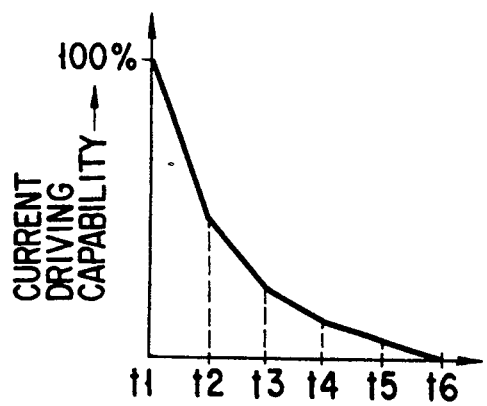

In the above embodiment, five clocked inverters 12 to 16 each has the same current driving capability are used. However, in such case, the stable oscillation operation is wrongly affected with the marked variation of the current driving capability due to the turn off of the last clocked inverter 16. Hence, as another modification, the current driving capabilities of five clocked inverters 12 to 16 can be reduced gradually by $\frac{1}{2}$, for example, with respect to that of the previous clocked inverter. This is shown in FIG. 10B. In this modification, the current driving capability is changed nonlinearly. More particularly, all the clocked inverters is operating during the time period $t_1$-$t_2$. At the time t2 when the clocked inverter 12 is caused to stop, the current driving capability of all the clocked inverters is reduced to half of that obtained at the time t1. At the time t3 when the clocked inverter 13 is caused to stop, the current driving capability of all the clocked inverters is further reduced to half of that obtained at the time t2. Like this, a bad influence upon the stable oscillation operation, which is caused by the turn off of the clocked inverter, can be suppressed by lowering the current driving capability of all the clocked inverters by 50%, for example, every turn off of the clocked inverter. At that time, the current driving capability of all the clocked inverters is not necessarily reduced by 50%. Namely, the current drive ability may be changed non-linearly, as shown in FIG. 10B.

Figure 10C:
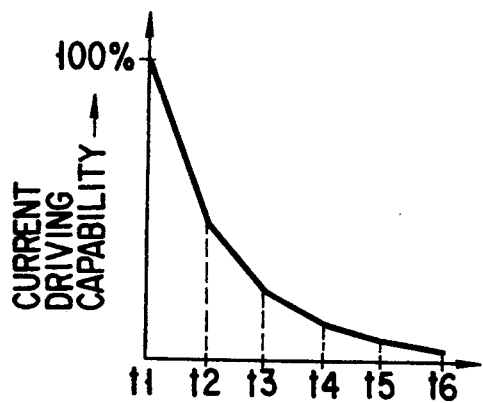

Moreover, as shown in FIG. 10C, it is possible that the operation of the last clocked inverter 16 is not stopped when the oscillation circuit is in oscillation operation.

Furthermore, in the first embodiment, constant-current sources are provided in both P-channel and N-channel transistor sides. However, as shown in FIGS. 11A and 11B, the constant-current source may be provided only in the P-channel transistor side and also, as shown in FIGS. 12A and 12B, the constant-current source may also be provided only in the N-channel transistor side.

Next, a second embodiment of the oscillation circuit according to the present invention will be described with reference to FIG. 13.

In the second embodiment, a circuit consisting of a CMOS inverter 61 and a voltage comparator 62 is used instead of the CMOC inverter 20 in which constant-current sources are connected between the power source voltage Vcc and the earth voltage Vss. Since the arrangement of the second embodiment except for the above circuit are identical to those of the circuit of FIG. 4, the descriptions thereof are omitted. The inverter 61 has the same threshold voltage as those of five clocked inverters 12 to 16. An input terminal and an output terminal of the inverter 61 are connected each other to short-circuit. Accordingly the inverter 61 generates an output voltage which is equivalent to a threshold value of the circuit. The output terminal of the inverter 61 is connected to a non-inverting input terminal (+) of the CMOS voltages comparator 62 using P-channel and N-channel MOS transistors. A constant-current source which is controlled by the predetermined voltage $V_{BiasN}$ is provided in the voltage comparator 62. The voltage $V_{BiasN}$ is generated by the same circuit as in FIG. 6. The inverting input terminal (−) of the voltage comparator 62 is connected to input terminals of five clocked inverters 12 to 16 in parallel. The output terminal of the comparator 62 is also connected to output terminals of five clocked inverters 12 to 16 in parallel. The comparator 62 compares a voltages inputted into the non-inverting input terminal with a voltage inputted into the inverting input terminal. An input voltage to the non-inverting input terminal is used as a threshold voltage for an input voltage to the inverting input terminal. The circuit consisting of the inverter 61 and the voltage comparator 62 operates an inverter for inverting the input signal, like the inverter 20 in the circuit in FIG. 4. In the second embodiment, the circuit threshold voltage of the inverter 61 is designed to be equal to those of five clocked inverter 12 to 16. Hence, even when the circuit threshold voltage of the clocked inverters 12 to 16 and the power source voltage are varied, the circuit consisting of the inverter 61 and the voltage comparator 62 is also affected by the above variations. As a result, when the variations in the circuit threshold voltage and the power source voltage occur, an operating point of the oscillation of the voltage comparator 62 which operates as an inverter also changes according to the above variations of the clocked inverters 12 to 16 to thus suppress the influence to the above variations.

Figure 13:
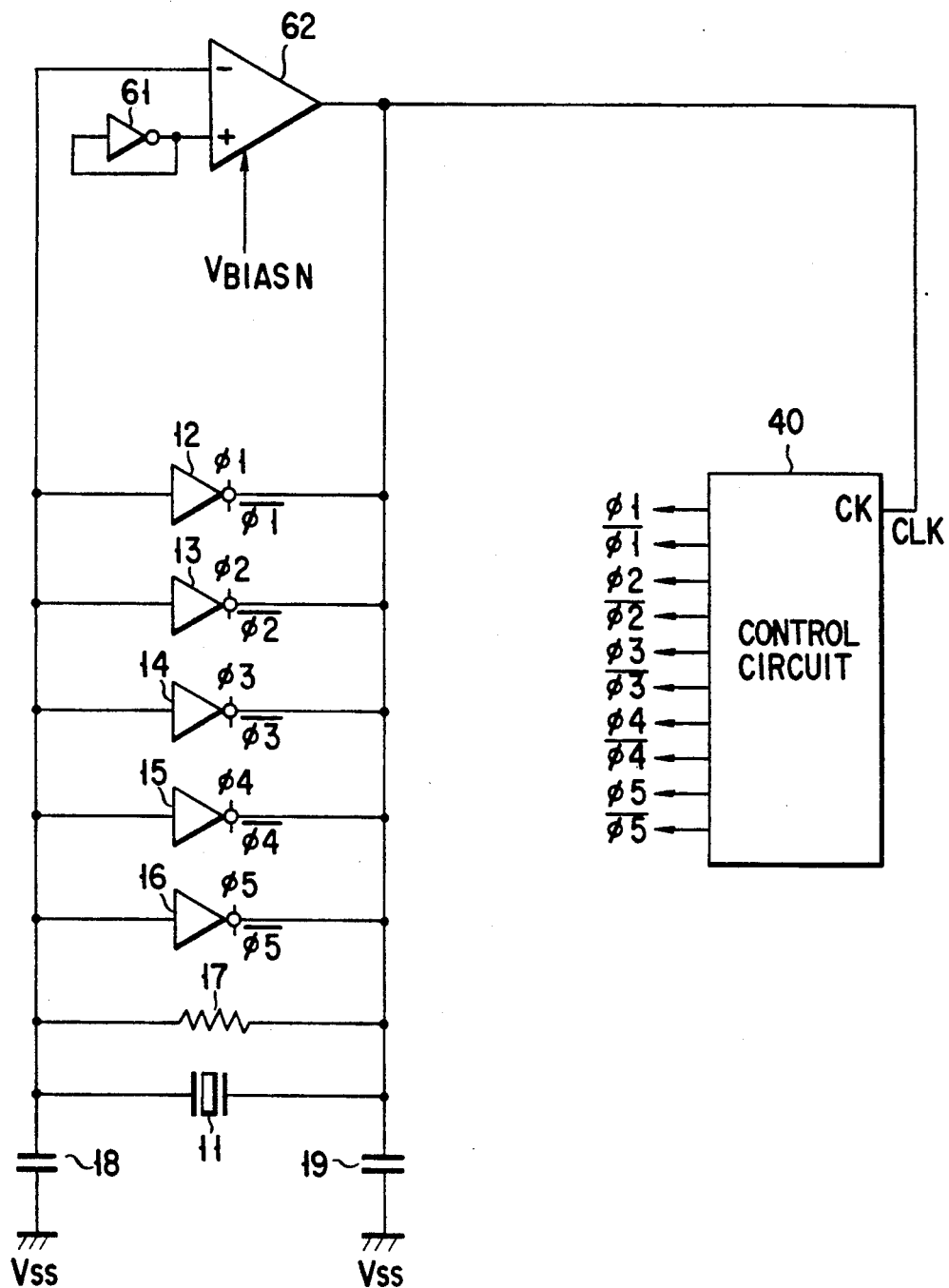
FIG. 13 is a circuit diagram of a second embodiment of an oscillation circuit according to the present invention when taken together.

FIG. 14 is a circuit diagram of an arrangement of the voltage comparator 62 in FIG. 13. The voltage comparator 62 comprises a differential pair which is made of a pair of N-channel MOS transistors 71 and 72; a current mirror circuit which is made of a pair of P-channel transistors 73 and 74 and operates as a load of the differential pair; a constant-current source made of N-channel MOS transistor 75; a P-channel MOS transistor 76 which receives an output from the differential pair; and a constant-current source made of N-channel MOS transistor 77. Sources of the transistors 71 and 72 are commonly connected. Drains of the transistors 73 and 74 are connected to drains of the transistors 71 and 72 respectively and gates thereof are commonly connected to a drain of the transistor 71. The bias voltage $V_{BiasN}$ is supplied to a gate of the transistor 75 which provides the differential pair with a predetermined operating current. The transistor 77 is serially connected to the output transistor 76. The bias voltage $V_{BiasN}$ is supplied to a gate of the transistor 77. The transistor 77 supplies a predetermined operating current to the output transistor 76.

With the above voltage comparator 62, a current flowing through the voltage comparator 62 may be limited by N-channel MOS transistors 75 and 77 of the constant-current source when only the circuit consisting of the inverter 61 and the voltage comparator 62 operates as the feedback circuit after all the clocked inverters 12 to 16 are turned off. Hence, a low consumption current may be attained in the oscillation circuit. A current is also consumed in the inverter 61. However, the inverter 61 may merely output a voltage equal to the circuit threshold voltage which is determined by a driving ratio of the P-channel side and the N-channel side of the oscillation circuit. Therefore, if a certain constant ratio is kept and gate lengths of both transistors are lengthened, a penetration current may be decreased sufficiently even talking the variations into consideration. Consequently, an increase in total consumption current is very little.

FIG. 15 is a circuit diagram of another arrangement of the voltage comparator 62 in FIG. 13. In this voltage comparator 62, a resistor 78 is inserted between a drain of the N-channel MOS transistor 72 which is a part of the differential pair and a common gate of a pair of P-channel MOS transistors 73 and 74 which comprises the current mirror circuit. A voltage amplification factor of the comparator 62 is lowered by the resistor 78. Thus an output waveform are not rectangular waveform due to the saturation of the voltage.

FIG. 16 is a circuit diagram of still another arrangement of the voltage comparator 62 in FIG. 13. As shown in FIG. 15, in case the voltage amplification factor of the voltage comparator is still high even when the resistor 78 is inserted between the common gate of the transistor 73 and 74 and the drain of the transistor 72, only the preceding differential pairs are used as a feedback circuit, but the succeeding inverter consisting of the P-channel MOS transistor 76, i.e., output transistor and the N-channel MOS transistor 77, i.e., constant-current source is used as a waveform shaping inverter.

In the case of the embodiment of FIG. 13, only a clocked inverter can also be used like the embodiment of FIG. 4. Likewise, as shown in FIG. 10B, the current driving capability of the clocked inverter can be set at half, for example, in contrast to that of the preceding clocked inverter, instead of setting the current driving capability of five clocked inverts 12 to 16 to be the same. Further, as shown in FIG. 10C, the last clocked inverter 16 is able to continue to operate.

As shown in FIG. 17, instead of the voltage comparator in the second embodiment, a CMOS linear amplifier circuit 91 can be used. The resistors 92 and 93 are provided as gain adjusting resistors.

In the embodiment of FIG. 13, the inverter 61 is used. However, the clocked inverter can be used so as to coincide the circuit threshold voltage with the threshold voltages of the clocked inverters 12 to 16, instead of the inverter 61. More particularly, since the clocked inverter is operated as the ordinary inverter in such case, the earth voltage VSS is supplied to one of two P-channel MOS transistors 95 and 96 whereas the power source voltages Vcc is supplied to one of two N-channel MOS transistors 97 and 98, as shown in FIG. 18.

As described above, the comparator having a low gain characteristic (FIG. 15) and the linear amplifier (FIG. 17) can be used in the second embodiment instead of the comparator 62 in FIG. 13. When the output signal of such comparator and such linear amplifier is waveform-shaped, the oscillation waveform of small amplitude can be surely amplified if the same arrangement circuit as such comparator and such linear amplifier is used as the waveform shaping means. In such case, the consumption current can also be controlled, as in the first embodiment in FIG. 4.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An oscillation circuit comprising:
   an oscillator composed of one of a quartz oscillator and a ceramic oscillator;
   a clocked inverter controlled so as to operate for a predetermined period of time after oscillation begins, an input and an output of which being connected across said oscillator; and
   an inverter having a constant-current means connected in serial in a path of a power source, an input and an output of which being connected across said oscillator.

2. An oscillation circuit comprising:
   an oscillator composed of one of a quartz oscillator and a ceramic oscillator;
   a plurality of clocked inverters having the same circuit threshold values and controlled such that all clocked inverters begin their operations at an oscillation start time and terminate their operations at different times from each other, inputs and outputs of which being connected in parallel across said oscillator; and an inverter having a constant-current means connected in serial in a path of a power source, an input and an output of which being connected across said oscillator.

3. An oscillation circuit according to claim 2, wherein each of said plurality of clocked inverters has the same output driving capabilities.

4. An oscillation circuit according to claim 2, wherein current driving capabilities of said plurality of clocked inverters are set such that a total output drive current of said plurality of clocked inverters is changed nonlinearly when operations of said plurality of clocked inverters are sequentially terminated.

5. An oscillation circuit according to claim 2, wherein the clocked inverter having a smallest output drive current value is controlled to operate continuously throughout from the oscillation start time to the oscillation termination time.

6. An oscillation circuit comprising:

an oscillator composed of one of a quartz oscillator and a ceramic oscillator;

a plurality of clocked inverters controlled such that each operates only for a different period of time after the oscillation begins, inputs and outputs of which being connected in parallel across said oscillator;

an inverter having the same circuit threshold value as said plurality of clocked inverters, an input and an output of which being short-circuited; and a voltage comparator having one input terminal, another input terminal and an output terminal and driven by a constant-current source, said one input terminal being connected to said output of said inverter an input node and an output node of which are short-circuited, said other input terminal being connected to said inputs of said plurality of clocked inverters, and said output terminal being connected to said outputs of said plurality of said clocked inverters.

7. An oscillation circuit according to claim 6, wherein each of said plurality of clocked inverters has the same output driving capabilities.

8. An oscillation circuit according to claim 6, wherein current driving capabilities of said plurality of clocked inverters are set such that a total output drive current of said plurality of clocked inverters is changed nonlinearly when operations of said plurality of clocked inverters are sequentially terminated.

9. An oscillation circuit according to claim 6, wherein the clocked inverter having a smallest output drive current value is controlled to operate continuously throughout from the oscillation start time to the oscillation termination time.

10. An oscillation circuit according to claim 6, wherein said voltage comparator comprises:

a differential pair composed of first and second transistors of a first conductivity, gates of which being connected to said one input terminal and said other input terminal respectively and sources of which being connected commonly;

a third transistor of a second conductivity, a source-drain connection of which is connected between a power source of a high electric potential side and said drain of said first transistor and a drain and a gate of which are commonly connected;

a fourth transistor of a second conductivity, a source-drain connection of which is connected between said power source of said high electric potential side and said drain of said second transistor and said gate of which is connected to said gate of said third transistor;

a fifth transistor of a first conductivity, a source-drain connection of which is connected between a power source of a low electric potential and a source common connecting point of said first and said second transistor and a gate of which is supplied by a predetermined bias voltage; and a resistor connected between said drain of said second transistor and a gate common connecting point of said third and fourth transistors.

11. An oscillation circuit according to claim 6, wherein said inverter has the same arrangement as those of said plurality of clocked inverters.

12. An oscillation circuit comprising:

an oscillator composed of one of a quartz oscillator and a ceramic oscillator;

a plurality of clocked inverters controlled to operate for a predetermined period of time after an oscillation starts, inputs and outputs of which being connected in parallel across said oscillator;

an inverter having the same circuit threshold value as said plurality of clocked inverters, an input and an output of which being short-circuited; and a linear amplifier circuit having one input terminal, another input terminal and an output terminal, said one input terminal being connected to said output of said inverter, said other input terminal being connected to said inputs of said plurality of clocked inverters, and said output terminal being connected to said outputs of said plurality of clocked inverters.

* * * * *